United States Patent
Honma

(10) Patent No.: US 7,528,041 B2
(45) Date of Patent: May 5, 2009

(54) METHOD OF MANUFACTURING SEMICONDUCTOR DEVICE THAT UTILIZES OXIDATION PREVENTION FILM TO FORM THICK AND THIN GATE INSULATOR PORTIONS

(75) Inventor: Toshihiro Honma, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 416 days.

(21) Appl. No.: 11/276,826

(22) Filed: Mar. 15, 2006

(65) Prior Publication Data
US 2006/0223269 A1 Oct. 5, 2006

(30) Foreign Application Priority Data
Mar. 29, 2005 (JP) ............................. 2005-094373

(51) Int. Cl.
*H01L 21/8234* (2006.01)
(52) U.S. Cl. .................. 438/275; 438/770; 438/981; 251/E21.258; 251/E21.625
(58) Field of Classification Search ............. 438/976, 438/981
See application file for complete search history.

(56) References Cited

U.S. PATENT DOCUMENTS
6,380,020 B1  4/2002 Shimizu
2004/0161897 A1* 8/2004 Kim et al. ............... 438/275

FOREIGN PATENT DOCUMENTS
JP          4/297063 A    10/1992

* cited by examiner

*Primary Examiner*—Stephen W Smoot
(74) *Attorney, Agent, or Firm*—Volentine & Whitt, P.L.L.C.

(57) ABSTRACT

A method of manufacturing a semiconductor device, including including preparing a semiconductor substrate having first to fourth active regions and field oxides, the third and fourth active regions sandwiching the second active region, and the field oxides isolating the first to fourth active regions; forming a protective film having openings over the second active region and the field oxide which adjoins the second active region, over the semiconductor substrate; forming the first gate insulator on the second active region; removing the protective film; forming second gate insulators thinner than the first gate insulators on the first, third and fourth active regions, respectively; forming gate electrodes on the first gate insulator over the first active region and on the second gate insulator over the second active region; and forming a pair of first doped regions in the first active region and second doped regions in the third and fourth active regions.

12 Claims, 12 Drawing Sheets

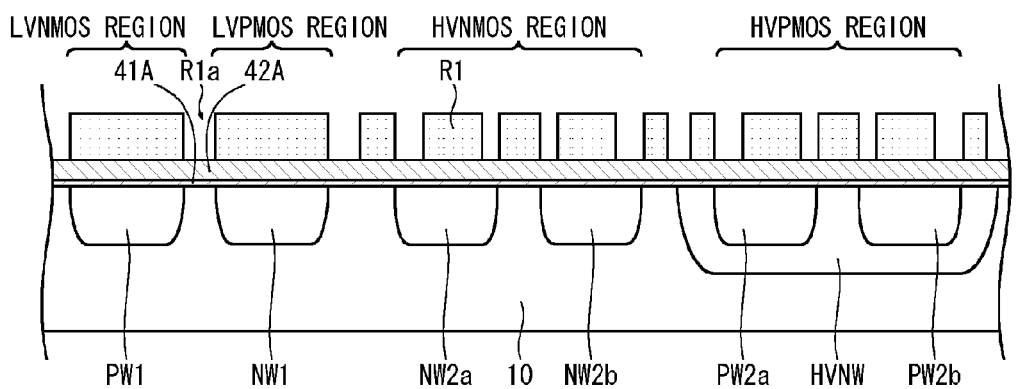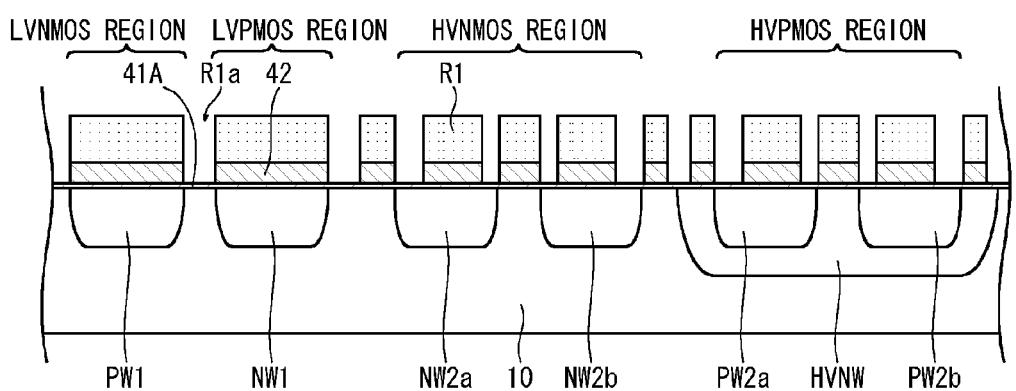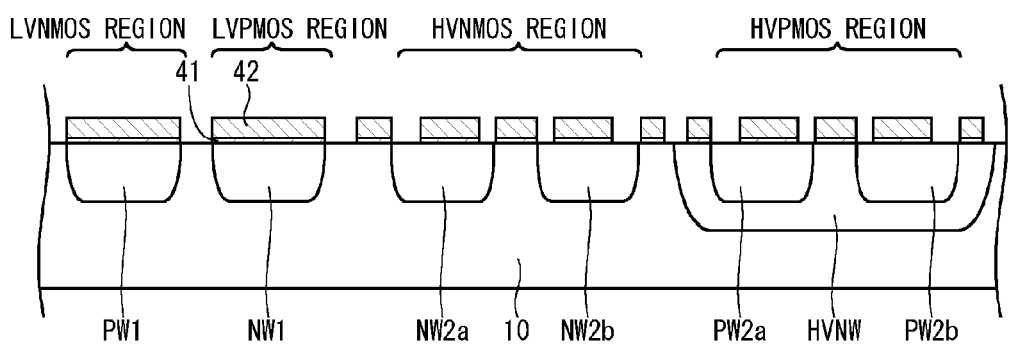

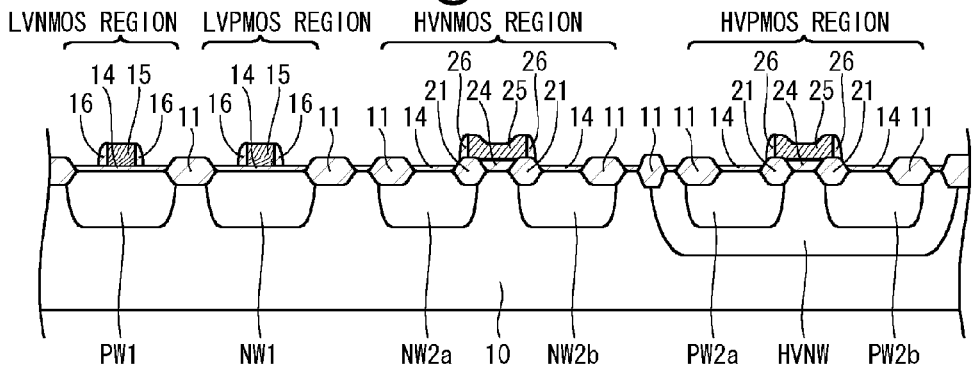
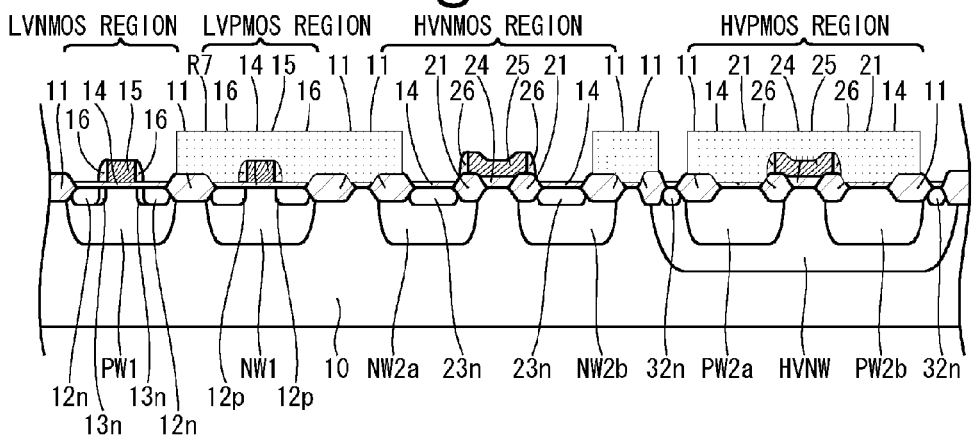
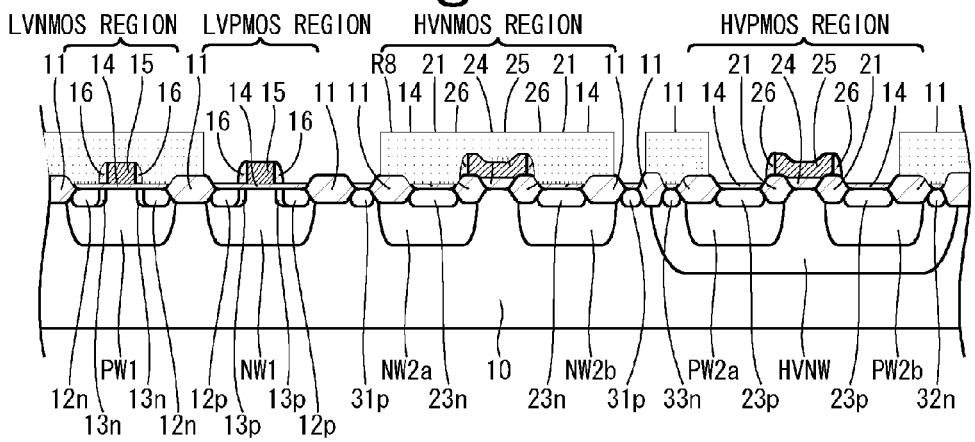

METHOD OF MANUFACTURING SEMICONDUCTOR DEVICE THAT UTILIZES OXIDATION PREVENTION FILM TO FORM THICK AND THIN GATE INSULATOR PORTIONS

BACKGROUND OF THE INVENTION

1. Field of the Invention

The present invention relates to a method of manufacturing a semiconductor device which in particular has multiple transistors having different withstand voltage characteristics formed on the same semiconductor substrate.

2. Background Information

In recent years, technology for forming multiple transistors with different withstand voltage characteristics has been developed (e.g. Japanese Laid-Open Patent Application No. 2000-349164 (hereinafter to be referred to as Patent Reference 1)).

Generally, a semiconductor device applying such technology for forming multiple transistors with different withstand voltage characteristics has a structure in which a MOS (Metal Oxide Semiconductor) transistor having a gate oxide with a first thickness (to be referred to as a first gate oxide) and a MOS transistor having a gate oxide with a second thickness (to be referred to as a second gate oxide) which is thicker than the first gate oxide are formed in a single semiconductor substrate. In the following description, the MOS transistor having the first gate oxide will be referred to as a high voltage MOS transistor, and the MOS transistor having the second gate oxide will be referred to as a low voltage MOS transistor. Moreover, a region in which the high voltage MOS transistor is to be formed will be referred to as a high voltage region, and a region in which the low voltage MOS transistor is to be formed will be referred to as a low voltage region.

Now, one example of a method of manufacturing such semiconductor device as mentioned above will be shown. In this manufacturing method, first, a field oxide is formed in the semiconductor substrate by a LOCOS (local oxidation of silicon) method for instance. Next, by conducting a thermal oxidation treatment on the surface of the semiconductor substrate, the first gate oxide is formed on the entire film of the semiconductor substrate. Next, the high voltage region is covered by a photoresist, and under this state, the first gate oxide is etched to expose the semiconductor substrate in the low voltage region. After that, the photoresist is removed, and then the entire surface of the semiconductor substrate is oxidized to form the second gate oxide in the low voltage region.

However, according to the above-described method, the comparatively thick first gate oxide gests over-etched, and thereby, the upper surface of the element separating insulation film (i.e. the LOCOS film) is also etched. Therefore, it has been a problem that the semiconductor substrate in the vicinity of a bird's-beak part of the element isolating film gets exposed.

A method for coping with such problem is disclosed in Patent Reference 1, for instance. In the following, this technology will be referred to as prior art technology 1. According to the prior art technology 1, first, a field oxide is formed in a semiconductor substrate using the LOCOS method, after which an oxide film (i.e. a buffer film) and a nitride film (i.e. a protective film) are formed sequentially. Next, by patterning this laminated structure, a high voltage region is exposed. Next, by conducting thermal oxidation on the exposed surface of the semiconductor substrate, a first gate oxide is formed. Next, the oxide film and the nitride film covering a low voltage region are removed, and then by conducting thermal oxidation on the surface of the semiconductor substrate exposed by removing these films, a second gate oxide is formed.

In this way, since the low voltage region is covered by the protective film at the time of forming the first gate oxide, it is not necessary to etch the first gate oxide at the time of forming the second gate oxide. Therefore, according to the prior art technology 1, it is possible to prevent the semiconductor substrate in the vicinity of a bird's-beak part of the field oxide from becoming exposed due to over etching at the time of removing the first gate oxide.

In addition, there are other methods of eliminating the process of etching the first gate oxide, such as the one introduced in Japanese Patent No. 3107582 (hereinafter to be referred to as Patent Reference 2). In the following, technology introduced in the Patent Reference 2 will be referred to as prior art technology 2. According to the prior art technology 2, a nitride film (i.e. a protective film) used in forming a field oxide by a LOCOS method is applied in forming a first gate oxide only in a region of a high voltage region where a gate electrode is to be formed. In this way, the process of etching the first gate oxide can be eliminated.

However, according to the prior art technology 1, the first gate oxide which is comparatively thick is formed on the entire surface of an element formation region (also called an active region) in the high voltage region, and therefore, at the time of forming doped regions, which function as a source and a drain, the first gate oxide of these regions needs to be etched. This can cause a problem that the field oxide on the side of the high voltage region gets etched and becomes thin. Particularly, in a semiconductor device having a structure in which a high voltage region is divided into three active regions (i.e. a region where a channel is to be formed, and a pair of regions where a source and a drain are formed) by field oxides, when the field oxides defining each active region becomes thin, it may lead to a problem that a withstand voltage characteristic etc. may be deteriorated.

According to the prior art technology 2, the protective film used in the LOCOS method is used as a protective film in forming the first gate oxide. Therefore, at the time of forming the first gate oxide, the field oxide in the low voltage region becomes thick as with the field oxide in the high voltage region. When the field oxide in the low voltage region becomes thick in this way, a response characteristic of the low voltage MOS transistor, which requires high-speed operation as compared with the high voltage MOS transistor, may be deteriorated, and this may cause a problem in which a required operation characteristic may not be obtained.

In view of the above, it will be apparent to those skilled in the art from this disclosure that there exists a need for an improved method of manufacturing a semiconductor device. This invention addresses this need in the art as well as other needs, which will become apparent to those skilled in the art from this disclosure.

SUMMARY OF THE INVENTION

It is therefore an object of the present invention to resolve the above-described problems, and to provide a method of manufacturing a semiconductor device which is capable of improving a withstand voltage characteristic of a high withstand voltage MOS transistor without having to deteriorate an operation characteristic of a low withstand voltage MOS transistor which requires comparatively high-speed operation.

In accordance with one aspect of the present invention, a method of manufacturing a semiconductor device comprises the steps of: preparing a semiconductor substrate having first to fourth active regions and element isolating insulation films, the third and fourth active regions sandwiching the second active region, and the element isolating insulation films isolating the first to fourth active regions, respectively; forming a protective film for preventing the semiconductor substrate from being oxidized, the protective film having openings over the second active region and the element isolating insulation film adjoining the second active region; forming the first gate insulation film on the second active region by conducting a thermal oxidation treatment on the semiconductor substrate exposed at the openings; removing the protective film; forming second gate insulation films on the first, third and fourth active regions, respectively, by conducting a thermal oxidation treatment, the second gate insulation films being thinner than the first gate insulation film; forming gate electrodes on the first gate insulation film over the first active region and on the second gate insulation film over the second active region, respectively; and forming a pair of first doped regions in the first active region and second doped regions in the third and fourth active regions.

In accordance with another aspect of the present invention, a method of manufacturing a semiconductor device comprises the steps of: preparing a semiconductor substrate having first to fourth active regions and element isolating insulation films, the third and fourth active regions sandwiching the second active region, and the element isolating insulation films isolating the first to fourth active regions, respectively; forming a protective film for preventing the semiconductor substrate from being oxidized, the protective film having openings over the second active region and the element isolating insulation film adjoining at least one of the second to fourth active regions; forming the first gate insulation film on the second active region by conducting a thermal oxidation treatment on the semiconductor substrate exposed at the openings; removing the protective film; forming second gate insulation films on the first, third and fourth active regions, respectively, by conducting a thermal oxidation treatment, the second gate insulation films being thinner than the first gate insulation film; forming gate electrodes on the first gate insulation film over the first active region and on the second gate insulation film over the second active region, respectively; and forming a pair of first doped regions in the first active region and second doped regions in the third and fourth active regions.

These and other objects, features, aspects, and advantages of the present invention will become apparent to those skilled in the art from the following detailed description, which, taken in conjunction with the annexed drawings, discloses preferred embodiments of the present invention.

BRIEF DESCRIPTION OF THE DRAWINGS

Referring now to the attached drawings which form a part of this original disclosure:

FIG. 2A to FIG. 2C are diagrams showing processes of manufacturing the semiconductor device 1 according to a manufacturing method of the first embodiment of the present invention;

FIG. 9A to FIG. 9C are diagrams showing processes of manufacturing the semiconductor device 1 according to the manufacturing method of the first embodiment of the present invention;

DETAILED DESCRIPTION OF THE PREFERRED EMBODIMENTS

Figure 1:
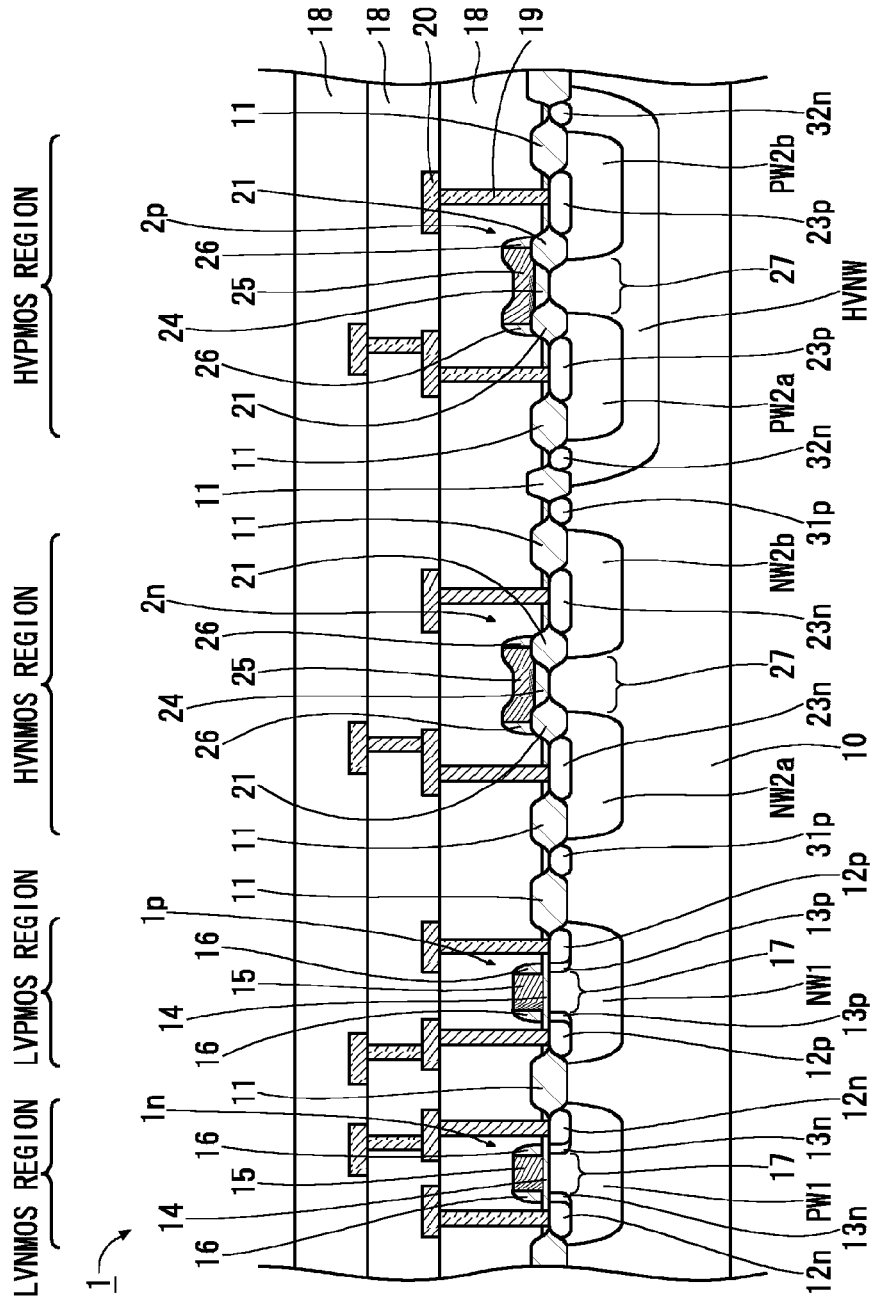
FIG. 1 is a sectional view showing a structure of a semiconductor device 1 according to a first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

First Embodiment

First, a first embodiment of the present invention will be described in detail with reference to the drawings. This embodiment will show a semiconductor device 1 as an example of the present invention. The semiconductor device 1 includes an n type MOS transistor for low withstand voltage (hereinafter to be referred to as a low voltage nMOS transistor) 1n, a p type MOS transistor for low voltage (hereinafter to be referred to as a low voltage pMOS transistor) 1p, an n type MOS transistor for high withstand voltage (hereinafter to be referred to as a high voltage nMOS transistor) 2n, and a p type MOS transistor for high withstand voltage (hereinafter to be referred to as a high voltage pMOS transistor) 2p. In this embodiment, the low voltage nMOS transistor 1n and the low voltage pMOS transistor 1p are considered to be part of an approximate 1.2~5.0 V (volt) system, and the high voltage nMOS transistor 2n and the high voltage pMOS transistor 2p are considered to be part of an approximate 20~150 V system, for instance.

Structure

FIG. 1 is a sectional view of a structure of the semiconductor device 1 according to the embodiment of the present invention. In FIG. 1, in order to show the low voltage nMOS transistor 1n, the low voltage pMOS transistor 1p, the high voltage nMOS transistor 2n and the high voltage pMOS transistor 2p all together, a section of the semiconductor device 1 cut along a line in the gate length direction is shown.

As shown in FIG. 1, the semiconductor device 1 has a semiconductor substrate 10 including a region where the low voltage nMOS transistor 1n is formed (i.e. an LVNMOS region/a first active region), a region where the low voltage pMOS transistor 1p is formed (i.e. an LVPMOS region/the first active region), a region where the high voltage nMOS transistor 2n is formed (i.e. an HVNMOS region/second to fourth active regions), and a region where the high voltage pMOS transistor 2p is formed (i.e. an HVPMOS region/the second to fourth active regions). Each of these regions is separated from the other adjacent regions by field oxides 11 (which are also called element isolating insulation films). Accordingly, an element formed in each of the above regions can be electrically isolated from the other elements in the adjacent regions. Furthermore, as to the high voltage nMOS transistor 2n in particular, its degree of electrical isolation with respect to the other adjacent elements is reinforced by having guard ring layers 31p surrounding the high voltage nMOS transistor 2n. Likewise, as to the high voltage pMOS transistor 2p, its degree of electrical isolation with respect to the other adjacent elements is reinforced by having guard ring layers 32n.

In the above-described structure, the semiconductor substrate 10 is a silicon substrate (e.g. a p type silicon substrate) to which p type impurities are doped in advance, for instance. The field oxide 11 is a silicon oxide ($Si_xO_y$) film formed using a LOCOS (local oxidation of silicon) method, for instance. In this case, as for the field oxide 11, it is also possible to have other kinds of insulation films such as a silicon oxide film formed using an STI (shallow trench isolation) method, for instance. However, considering a withstand voltage characteristic, it is preferable that a silicon oxide film formed using the LOCOS method is applied.

As mentioned above, the guard ring layers 31p and 32n are regions for reinforcing the degree of electrical isolation between adjacent elements. Especially, each of the guard ring layers 31p should preferably be disposed between the high voltage nMOS transistor 2n and the other element in its adjacent, and each of the guard ring layers 32n should preferably be disposed between the high voltage pMOS transistor 2p and the other element in its adjacent. The guard ring layers 31p surrounding the high voltage nMOS transistor 2n are regions where p type impurities are doped for instance. Here, as for the p type impurities, it is possible to use boron (B) ions for instance, and a dose amount thereof may be around $6.0 \times 10^{15}/cm^2$ for instance. On the other hand, the guard ring layers 32n surrounding the high voltage pMOS transistor 2p are regions where n type impurities are doped for instance. Here, as for the n type impurities, it is possible to use phosphorous (P) ions for instance, and a dose amount thereof may be around $5.0 \times 10^{15}/cm^2$ for instance.

Low Withstand Voltage nMOS Transistor 1n

Among the regions divided by the field oxides 11, as shown in FIG. 1, the low voltage nMOS transistor 1n in the LVNMOS region has a well region PW1 (hereinafter to be referred to as a p well region PW1) formed by having p type impurities doped into the LVNMOS region, a gate insulator 14 formed on the p well region PW1, a gate electrode 15 formed on the gate insulator 14, sidewall spacers 16 formed on two sides of the gate electrode 15, and a pair of lightly doped regions 12n and a pair of highly doped regions 13n each pair formed in a way sandwiching a region underneath the gate electrode 15 in the p well region PW1. The region underneath the gate electrode 15 which is sandwiched by the lightly doped regions 12n is a region where a channel is to be formed. In the following, this region will be referred to as a channel forming region 17.

As described above, the p well region PW1 is a region where p type impurities are doped. Here, as for the p type impurities, it is possible to use boron (B) ions for instance, and a dose amount thereof may be around $1 \times 10^{12} \sim 1 \times 10^{13}/cm^2$ for instance.

The gate insulator 14 formed on the p well region PW1 is a silicon oxide film formed by conducting a thermal oxidation treatment on the surface of the semiconductor substrate 10 for instance, and it may be around 2~20 nm (nanometer) thick for instance.

The gate electrode 15 formed on the gate insulator 14 is a poly-silicon film which is given conductivity by including predetermined impurities for instance, and it may be around 500 nm thick for instance.

Each of the sidewall spacers 16 formed on the sides of the gate electrode 15 is a film made of an insulator such as silicon oxide or silicon nitride ($Si_xN_y$) for instance. This sidewall spacer 16 functions as a spacer that defines a distance between the highly doped region 12n and the gate electrode 15. Here, a width of the sidewall spacer 16 (a width in the gate length direction) may be around 100~200 nm for instance.

The lightly doped regions 12n formed in the p well region PW1 in a way sandwiching the region underneath the gate electrode 15 are regions where n type impurities are doped. Here, as for the n type impurities, it is possible to use phosphorous (P) ions for instance, and a dose amount thereof may be around $1 \times 10^{12} \sim 1 \times 10^{13}/cm^2$ for instance. The lightly doped regions 12n function as an offset source and an offset drain, respectively, in the low voltage nMOS transistor 1n.

The highly doped regions 13n formed on at least the surfaces of the lightly doped regions 12n are regions where n type impurities are doped. The highly doped regions 13n function as a source and a drain, respectively, in the low voltage nMOS transistor 1n. Here, as for the n type impurities, it is possible to use phosphorous (P) ions for instance, and a dose amount thereof should be greater than the dose amount of the n type impurities in the lightly doped region 12n and it may be around $5.0 \times 10^{15}/cm^2$ for instance.

Low Withstand Voltage pMOS Transistor 1p

Among the regions divided by the field oxides 11, the low voltage pMOS transistor 1p in the LVPMOS region has a well region NW1 (hereinafter to be referred to as an n well region NW1) formed by having n type impurities doped into the LVPMOS region, a gate insulator 14 formed on the n well region NW1, a gate electrode 15 formed on the gate insulator 14, sidewall spacers 16 formed on two sides of the gate electrode 15, and a pair of lightly doped regions 12p and a pair of highly doped regions 13p each pair formed in a way sandwiching a region underneath the gate electrode 15 in the n well region NW1. In this structure, the structures of the gate insulator 14, the gate electrode 15 and the sidewall spacers 16 are the same as those in the low voltage nMOS transistor 1n. In addition, the region underneath the gate electrode 15 sandwiched by the lightly doped regions 12p functions as a channel forming region 17 as with the low voltage nMOS transistor 1n.

As described above, the n well region NW1 is a region where n type impurities are doped. Here, as for the n type impurities, it is possible to use phosphorous (P) ions for instance, and a dose amount thereof may be around $1 \times 10^{12} \sim 10^{13}/cm^2$ for instance.

The lightly doped regions 12p formed in the n well region NW1 in a way sandwiching the region underneath the gate electrode 15 are regions where p type impurities are doped. Here, as for the p type impurities, it is possible to use boron (B) ions for instance, and a dose amount thereof may be around $1\times10^{12}$~$1\times10^{13}$/cm$^2$ for instance. The lightly doped regions 12$p$ function as an offset source and an offset drain, respectively, in the low voltage pMOS transistor 1$p$.

The highly doped regions 13$p$ formed on at least the surfaces of the lightly doped regions 12$p$ are regions where p type impurities are doped. The highly doped regions 13$p$ function as a source and a drain, respectively, in the low voltage pMOS transistor 1$p$. Here, as for the p type impurities, it is possible to use boron (B) ions for instance, and a dose amount thereof should be greater than the dose amount of the p type impurities in the lightly doped region 12$p$ and it may be around $6.0\times10^{15}$/cm$^2$ for instance.

High Withstand Voltage nMOS Transistor 2$n$

Among the regions divided by the field oxides 11, as shown in FIG. 1, the high voltage nMOS transistor 2$n$ in the HVNMOS region has a structure in which each of two doped regions 23$n$ (which function as a source and a drain, respectively) and a channel forming region 27 where a channel is to be formed are separated from one another by a field oxide 21. Therefore, the high voltage nMOS transistor 2$n$ in this embodiment has a total of three active regions including an active region functioning as the channel forming region 27 (i.e. the second active region), and two active regions functioning as a source and a drain, respectively (i.e. the third and the fourth active regions), each of which is separated from the other adjacent region(s) by the field oxide(s) 21.

On the channel forming region 27 separated from the other adjacent regions by the field oxides 21, a gate insulator 24 and a gate electrode 25 are formed sequentially. Sidewall spacers 26 are formed on two sides of the gate electrode 25. In two regions sandwiching the channel forming region 27 via the field oxides 21, respectively, n well regions NW2$a$ and NW2$b$ are formed, respectively. On the surfaces of the n well regions NW2$a$ and NW2$b$, doped regions 23$n$ are formed, respectively.

In the above structure, the gate insulator 24 formed on the channel forming region 27 is a silicon oxide film formed by conducting a thermal oxidation treatment on the surface of the semiconductor substrate 10 for instance, and it may be around 50~300 nm thick for instance.

The gate electrode 25 formed on the gate insulator 24 is a poly-silicon film which is given conductivity by including predetermined impurities for instance, and it may be around 500 nm thick for instance.

The sidewall spacers 26 formed on the sides of the gate electrode 25 are insulating films such as silicon nitride (Si$_x$N$_y$) films for instance. Here, a width of the sidewall spacer 26 (a width in the gate length direction) may be around 100~200 nm for instance.

The n well regions NW2$a$ and NW2$b$ are regions where n type impurities are doped. Here, as for the n type impurities, it is possible to use phosphorous (P) ions for instance, and a dose amount thereof may be around $1\times10^{12}$~$1\times10^{13}$/cm$^2$ for instance. The n well regions NW2$a$ and NW2$b$ function as an offset source and an offset drain, respectively, in the high voltage nMOS transistor 2$n$.

The doped regions 23$n$ formed on the surfaces of the n well regions NW2$a$ and NW2$b$, respectively, are regions where n type impurities are doped. The doped regions 23$n$ function as a source and a drain, respectively, in the high voltage nMOS transistor 2$n$. Here, as for the n type impurities, it is possible to use phosphorous (P) ions for instance, and a dose amount thereof may be around $5.0\times10^{15}$/cm$^2$ for instance.

High Withstand Voltage pMOS Transistor 2$p$

Among the regions divided by the field oxides 11, the high voltage pMOS transistor 2$p$ in the HVPMOS region has a structure in which each of two doped regions 23$p$ (which function as a source and a drain, respectively) and a channel forming region 27 where a channel is to be formed are separated from one another by a field oxide 21. Therefore, the high voltage pMOS transistor 2$p$ in this embodiment has a total of three active regions including an active region functioning as the channel forming region 27, and two active regions functioning as a source and a drain, respectively, each of which is separated from the other adjacent region(s) by the field oxide(s) 21.

As shown in FIG. 1, in the HVPMOS region in the semiconductor substrate, an n well region HVNW is formed by doping n type impurities. The high voltage pMOS transistor 2$p$ includes a gate insulator 24 formed on the channel forming region 27 which is separated from the other adjacent regions by the element isolation insulation films 21 in the n well region HVNW, a gate electrode 25 formed on the gate insulator 24, and sidewall spacers 26 formed on two sides of the gate electrode 25. Structures of the gate insulator 24, the gate electrode 25 and the sidewall spacers 26 are the same as those in the high voltage nMOS transistor 2$n$. In two regions sandwiching the channel forming region 27 via the field oxides 21, respectively, p well regions PW2$a$ and PW2$b$ are formed, respectively. On the surfaces of the p well regions PW2$a$ and PW2$b$, doped regions 23$p$ are formed, respectively.

The n well region HVNW is a region where n type impurities are doped. Here, as for the n type impurities, it is possible to use phosphorous (P) ions for instance, and a dose amount thereof may be around $1\times10^{12}$~$1\times10^{13}$/cm$^2$ for instance.

The p well regions PW2$a$ and PW2$b$ formed in the n well region HVNW are regions where p type impurities are doped. Here, as for the p type impurities, it is possible to use boron (B) ions for instance, and a dose amount thereof may be around $1\times10^{12}$~$1\times10^{13}$/cm$^2$ for instance. The p well regions PW2$a$ and PW2$b$ function as an offset source and an offset drain, respectively, in the high voltage pMOS transistor 2$p$.

The doped regions 23$p$ formed on the surfaces of the p well regions PW2$a$ and PW2$b$, respectively, are regions where p type impurities are doped. The doped regions 23$p$ function as a source and a drain, respectively, in the high voltage pMOS transistor 2$p$. Here, as for the p type impurities, it is possible to use boron (B) ions for instance, and a dose amount thereof may be around $6.0\times10^{15}$/cm$^2$ for instance.

On the semiconductor substrate 10 where the transistors are formed in the above-described manner, one or more interlayer insulation films 18 are formed. In each interlayer insulation film 18, wiring layers 20 for inter-element electrical connections are formed. In addition, at least on the interlayer insulation film 18 immediately above the semiconductor substrate 10, contact holes for exposing the highly doped regions 13$n$ and 13$p$ of the low voltage nMOS transistor 1$n$ and the low voltage pMOS transistor 1$p$, respectively, and the doped regions 23$n$ and 23$p$ of the high voltage nMOS transistor 2$n$ and the high voltage pMOS transistor 2$p$, respectively, are formed. In addition, the other interlayer insulation films 18 has contact holes which are formed between upper and lower wiring layers 20. Interiors of these contact holes are filled with conductive material such as tungsten (W) to form contact plugs 19. By this arrangement, each transistor can be electrically connected with the wiring layers 20.

Manufacturing Method

Now, a method of manufacturing the semiconductor device 1 according to the first embodiment of the present invention will be described in detail with reference to the drawings. FIG. 2A to FIG. 9C are diagrams showing processes of manufacturing the semiconductor device 1 according to this embodiment.

In this manufacturing method, first, a semiconductor substrate 10 having n well regions NW1, NW2a, NW2b and HVNW and p well regions PW1, PW2a and PW2b in each active region is prepared. Then, by conducting a thermal oxidation treatment on the semiconductor substrate 10, a silicon oxide film 41A having a thickness of about 10 nm, for instance, is formed on the semiconductor substrate 10. Then, by depositing silicon nitride over the semiconductor substrate 10 using a known CVD (Chemical Vapor Deposition) method for instance, a silicon nitride film 42A having a thickness of about 20 nm, for instance, is formed on the silicon oxide film 41A. Then, by conducting a known photolithographic process, a photoresist R1 having openings R1a over regions where field oxides 11 are to be formed in a post process is formed on the silicon nitride film 42A, as shown in FIG. 2A. The regions where field oxides 11 are to be formed are called field regions.

Next, by etching the silicon nitride film 42A while using the photoresist R1 as a mask, parts of the silicon oxide film 41A under the openings R1a are exposed, as shown in FIG. 2B. By this process, the silicon nitride film 42A is processed into a silicon nitride film 42. This silicon nitride film 42 is a protective film for preventing the semiconductor substrate 10 from being oxidized. As for etching the silicon nitride film 42A, it is possible to use a known dry etching method or a known wet etching method. After etching the silicon nitride film 42A, the photoresist R1 is removed.

Next, by etching the silicon oxide film 41A while using the silicon nitride film 42 as a mask, the field regions in the semiconductor substrate 10 are exposed, as shown in FIG. 2C. By this process, the silicon oxide film 41A is processed into a silicon oxide film 41. This silicon oxide film 41 is a buffer film for making the silicon nitride film 42 and the semiconductor substrate 10 stick together. As for etching the silicon oxide film 41A, it is possible to use a known dry etching method or a known wet etching method.

Figure 3A:
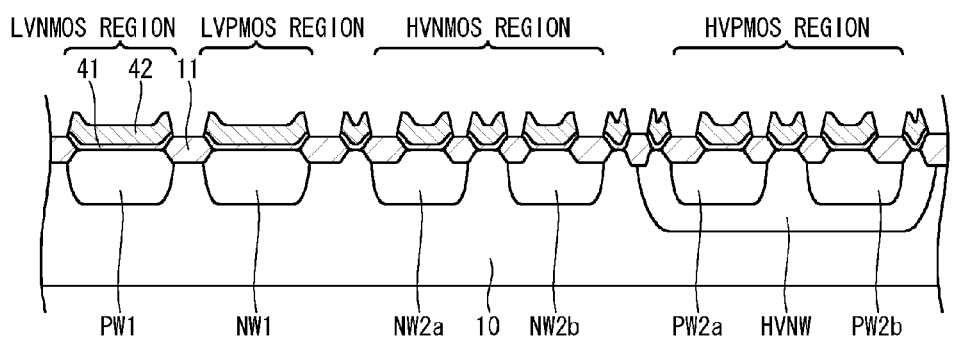
FIG. 3A to FIG. 3C are diagrams showing processes of manufacturing the semiconductor device 1 according to the manufacturing method of the first embodiment of the present invention.

Next, by conducting a thermal oxidation treatment on the exposed semiconductor substrate 10 while using the silicon nitride film 42 having openings over the field regions as a mask, field oxides 11 are formed as shown in FIG. 3A. These field oxides 11 isolate an LVNMOS region, an LVPMOS region, a HVNMOS region and a HVPMOS region from one another, isolate a region which is to become a channel forming region 27 and a region where doped regions 23n are to be formed in the HVNMOS region from each other, and isolate a region which is to become a channel forming region 27 and a region where doped regions 23p are to be formed in the HVPMOS region from each other.

Figure 3B:
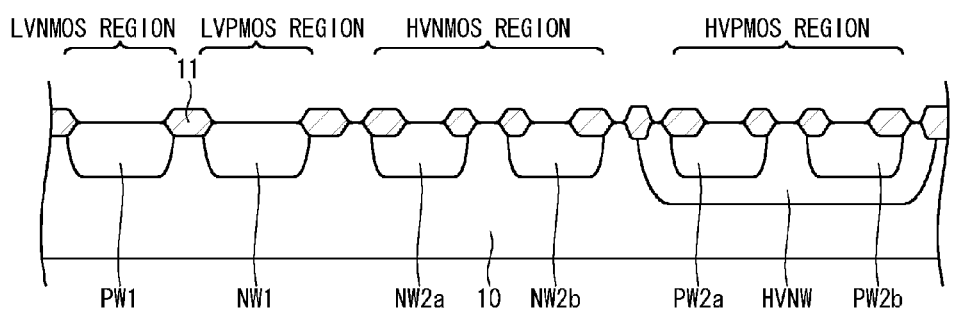

Next, by removing the silicon nitride film 42 and the silicon oxide film 41 sequentially, active regions in the semiconductor substrate 10 are exposed, as shown in FIG. 3B. Here, in order to remove only the silicon nitride film 42 while preventing the semiconductor substrate 10 from being damaged, it is preferable to use a wet etching method for etching the silicon nitride film 42. In this wet etching process, for instance, a thermal phosphoric acid liquid of approximately 86% concentration at a temperature of around 160° C. can be used. On the other hand, in order to remove only the silicon oxide film 41 while preventing the semiconductor substrate 10 from being damaged, it is preferable to use a wet etching method for etching the silicon oxide film 41. In this wet etching process, for instance, a hydrofluoric acid liquid of approximately 5% concentration at a temperature of around 25° C. can be used.

Figure 3C:
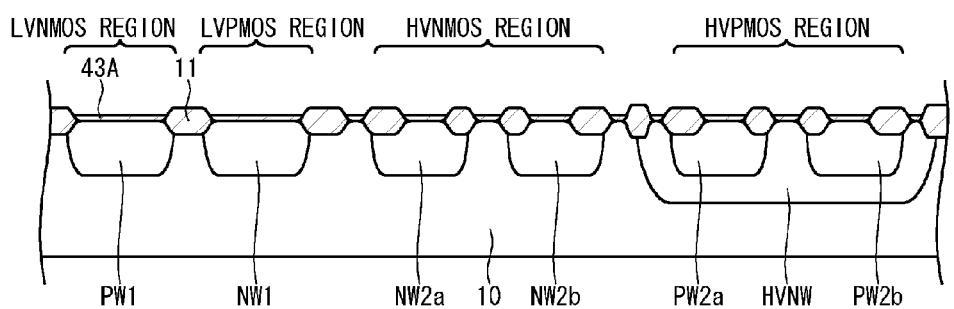

Next, by conducting a thermal oxidation treatment on the exposed semiconductor substrate 10, silicon oxide films 43A having a thickness of about 10 nm, for instance, are formed on the active regions, as shown in FIG. 3C. In addition, it is not a problem even if the field oxides 11 become thicker by this thermal oxidation treatment.

Figure 4A:
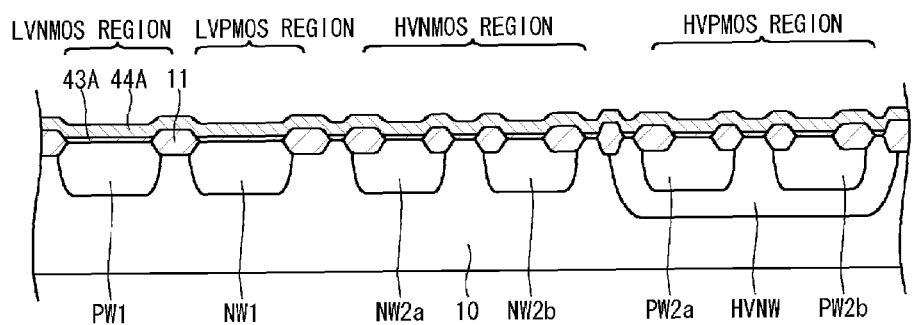
FIG. 4A and FIG. 4B are diagrams showing processes of manufacturing the semiconductor device 1 according to the manufacturing method of the first embodiment of the present invention.

Next, by depositing silicon nitride over the semiconductor substrate 10 using a known CVD method, a silicon nitride film 44A having a thickness of about 20 nm, for instance, is formed on the silicon oxide film 43A and the field oxides 11, as shown in FIG. 4A.

Figure 4B:
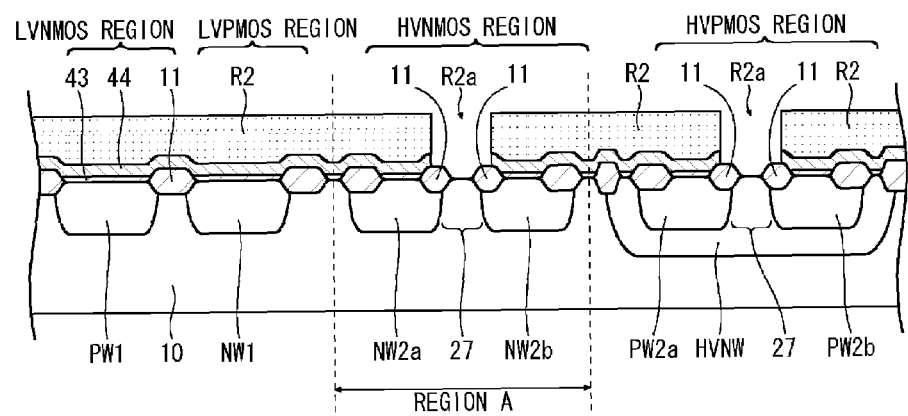

Next, by conducting a known photolithographic process, a photoresist R2 is formed on the silicon nitride film 44A. The photoresist R2 has openings R2a over a region where a gate electrode 25 is to be formed in the HVNMOS region, over a region where a gate electrode 25 is to be formed in the HVPMOS region, and over the field oxides 11 isolating these regions where the gate electrodes 25 are to be formed, respectively. Then, as with the processes described with reference to FIG. 2B and FIG. 2C, by etching the silicon nitride film 44A while using the photoresist R2 as a mask and etching the silicon oxide film 43A while using the processed silicon nitride film 44A (i.e. a silicon nitride film 44) as a mask, the semiconductor substrate 10 under the opening R2a is exposed, as shown in FIG. 4B. By these processes, the silicon nitride film 44A is processed into the silicon nitride film 44 and the silicon oxide film 43A is processed into a silicon oxide film 43. Because the silicon nitride film 44A is processed using the photoresist R2 as a mask, it is possible to easily form the protective film (i.e. the silicon nitride film 44) with a desired shape by only using a photo-mask used for forming the photoresist R2.

Figure 5:
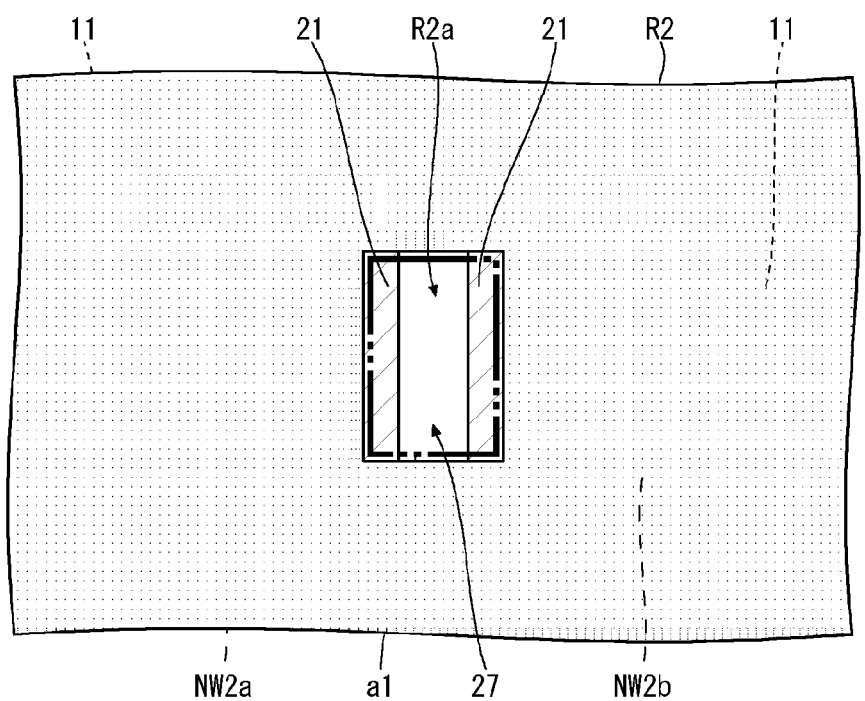
FIG. 5 is a diagram showing the region A in FIG. 4B when viewed from above.

Here, an enlarged overhead view of a region A in FIG. 4B is shown in FIG. 5. As shown in FIG. 5, the photoresist R2 formed in the process shown in FIG. 4B has the opening R2a over a region where a gate insulator 24 is to be formed in the HVNMOS region, i.e. over the channel forming region 27 and at least parts of the field oxides 11 sandwiching this channel forming region 27 in the HVNMOS region. Therefore, in the process shown in FIG. 4B, openings are formed over a region a1 (shown in FIG. 5) where the gate electrode 25 is formed and the field oxides 11 adjoining the region a1. Thereby, the silicon nitride film 44A and the silicon oxide film 43A are removed from over these regions (i.e. the region a1 where the gate electrode 25 is formed and the field oxides 11 adjoining the region a1) and parts of the semiconductor substrate 10 in these regions are exposed. This structure is the same as the structure in the HVPMOS region. After etching the silicon nitride film 44A, the photoresist R2 is removed.

Figure 6A:
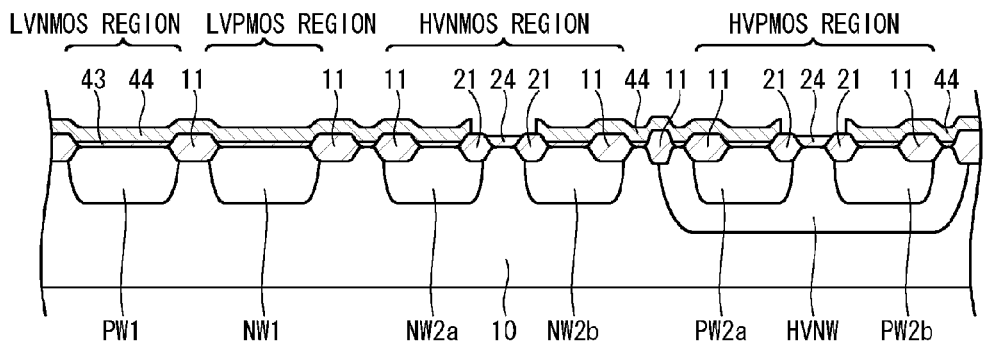
FIG. 6A to FIG. 6C are diagrams showing processes of manufacturing the semiconductor device 1 according to the manufacturing method of the first embodiment of the present invention.

Next, by conducting a thermal oxidation treatment on the surface of the semiconductor substrate 10 while using the silicon nitride film 44 as a mask, gate insulators 24, each having a thickness of about 50 nm, for instance, are formed on the exposed semiconductor substrate 10, as shown in FIG. 6A. By this thermal oxidation treatment, the exposed field oxides 11 become thicker. The field oxides 11 thicken by this process are referred to as field oxides 21.

Figure 6B:
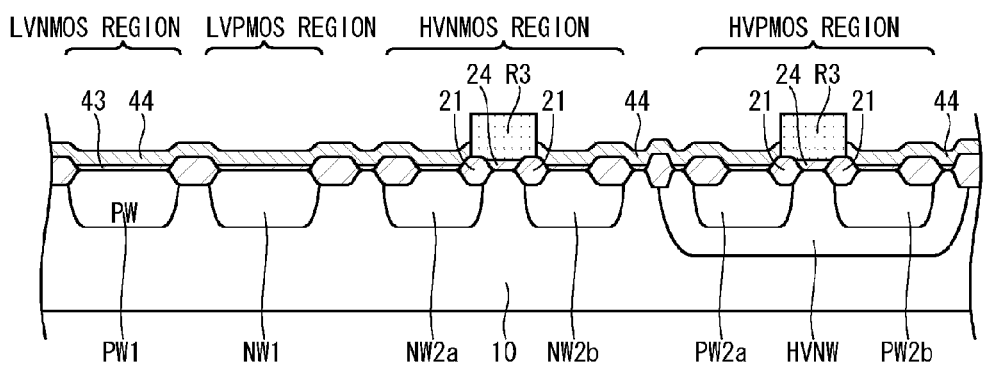

Next, by conducting a known photolithographic process, as shown in FIG. 6B, a photoresist R3 is formed on the exposed gate insulator 24 and the exposed field oxides 21.

Figure 6C:
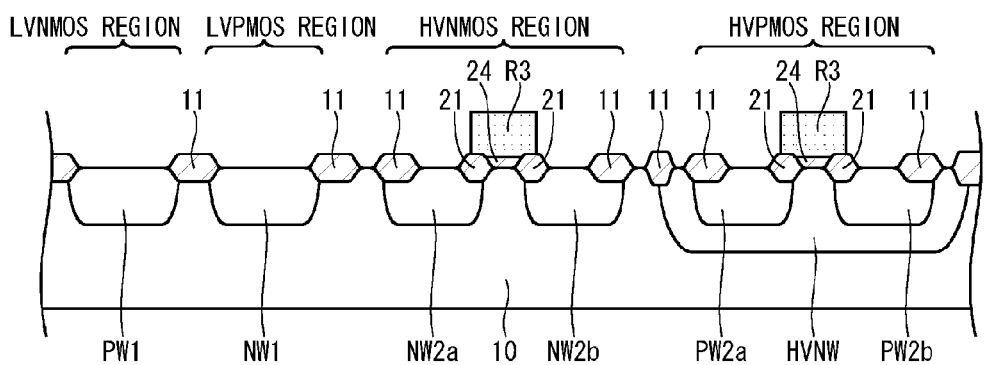

Next, by etching the silicon nitride film 44 and the silicon oxide film 43, sequentially, while using the photoresist R3 as a mask, the active regions except for the parts under the gate insulator 24 and the field oxides 11 and 21 are exposed, as shown in FIG. 6C. Here, in order to remove only the silicon nitride film 44 while preventing the semiconductor substrate 10 from being oxidized, as in the case of etching of the silicon nitride film 42 described above, it is preferable to use a wet etching method for etching the silicon nitride film 44. In this wet etching process, for instance, a thermal phosphoric acid liquid of approximately 86% concentration at a temperature of around 160° C. can be used. On the other hand, in order to remove only the silicon oxide film 43 while preventing the semiconductor substrate 10 from being damaged, as in the case of etching the silicon oxide film 41 described above, it is preferable to use a wet etching method for etching the silicon oxide film 43. In this wet etching process, for instance, a hydrofluoric acid liquid of approximately 5% concentration at a temperature of around 25° C. can be used.

Figure 7A:
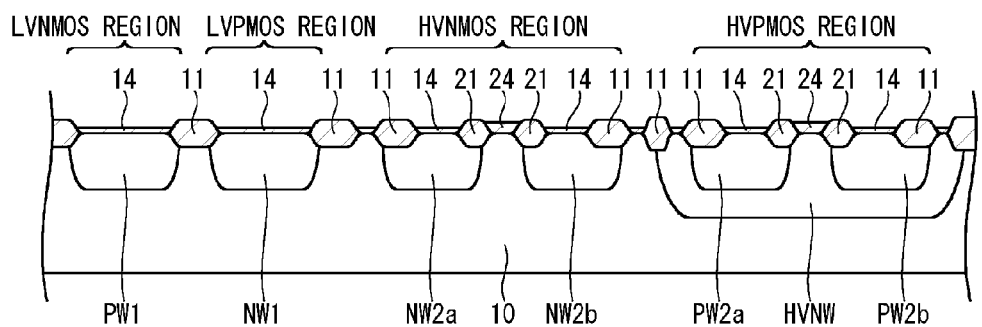
FIG. 7A to FIG. 7C are diagrams showing processes of manufacturing the semiconductor device 1 according to the manufacturing method of the first embodiment of the present invention.

Next, by conducting a thermal oxidation treatment on the exposed semiconductor substrate 10, gate insulators 14, each having a thickness of about 10nm, for instance, are formed on the exposed active regions, as shown in FIG. 7A. In addition, it is not a problem even if the field oxides 11 and 21 become thicker by this thermal oxidation treatment.

Figure 7B:
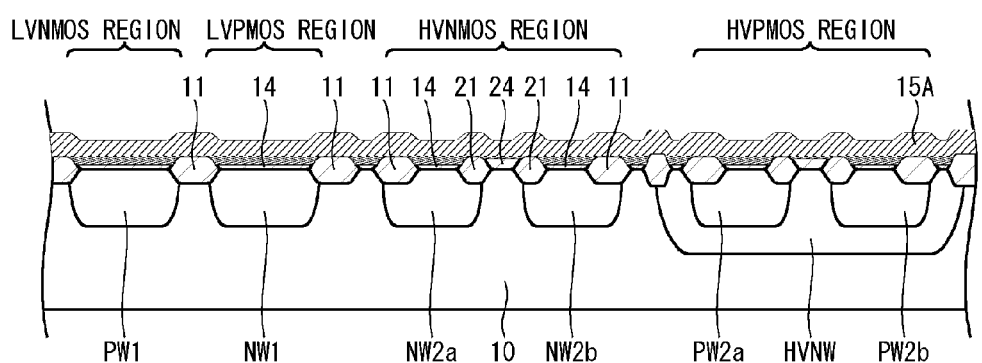

Next, by depositing polysilicon on the semiconductor substrate 10 using a known CVD method, a polysilicon film 15A having a thickness of about 500 nm, for instance, is formed on the gate insulators 14 and 24 and the field oxides 11, as shown in FIG. 7B. The polysilicon film 15A is made electrically conductive by including predetermined impurities and it is to be processed into the gate electrodes 15 and 25 in a post process.

Figure 7C:
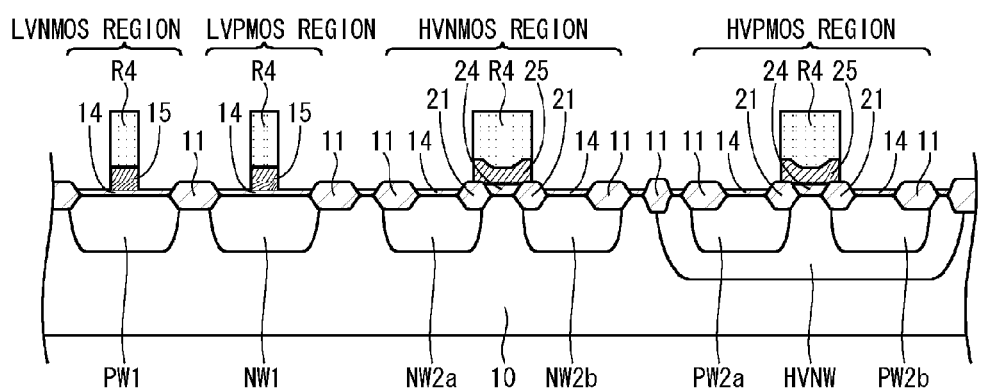

Next, by conducting a known photolithographic process, a photoresist R4 having openings of which opening shapes are the same as the upper shapes of the gate electrodes 15 and 25 is formed on the polysilicon film 15A. Then, by etching the polysilicon film 15A while using the photoresist R4 as a mask, the gate electrodes 15 and 25 made of polysilicon including predetermined impurities are formed on the gate insulators 14 and 24 and a part of the field oxides 21, as shown in FIG. 7C. After etching the polysilicon film 15A, the photoresist R4 is removed.

Figure 8A:
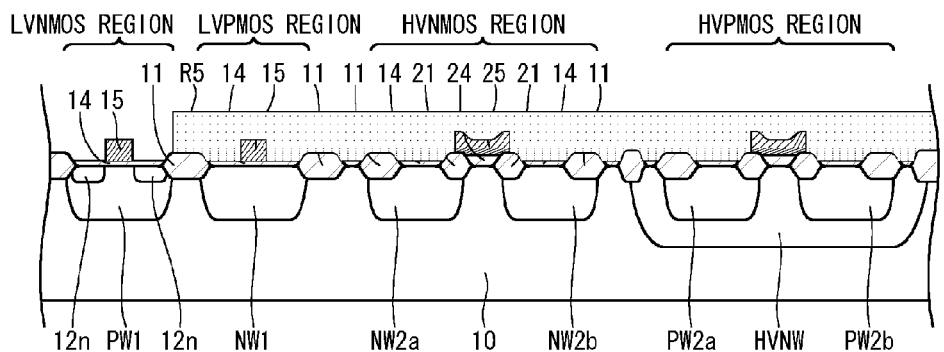
FIG. 8A to FIG. 8C are diagrams showing processes of manufacturing the semiconductor device 1 according to the manufacturing method of the first embodiment of the present invention.

Next, by conducting a known photolithographic process, a photoresist R5 covering the HVNMOS region, the HVPMOS region and the LVPMOS region is formed over the semiconductor substrate 10. Then, by doping n-type impurities (e.g. phosphorus ions) into the semiconductor substrate 10 while using the photoresist R5, the field oxides 11 and the gate electrodes 15 as masks, a pair of lightly doped regions 12$n$ sandwiching the region underneath the gate electrode 15 is formed in the LVNMOS region in a self-alignment manner, as shown in FIG. 8A. In this process, as described above, a dose amount of the n-type impurities can be set to about $1 \times 10^{12}$ to $1 \times 10^{13}$/cm$^2$, for instance. After doping the n-type impurities, the photoresist R5 is removed.

Figure 8B:
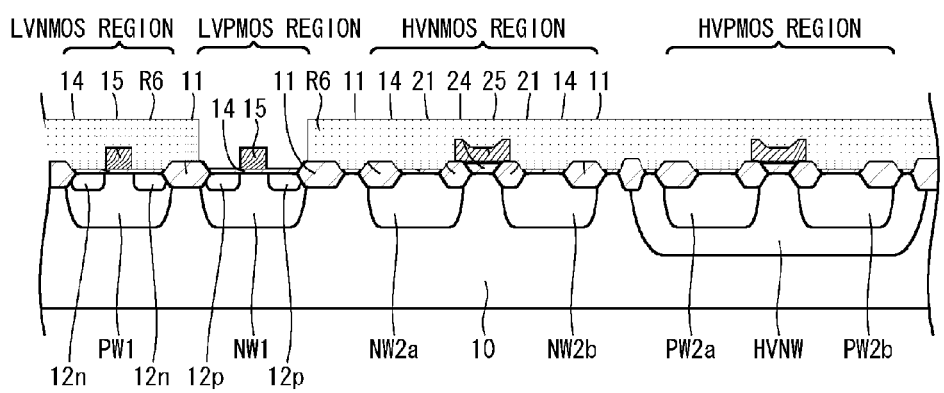

Next, by conducting a known photolithographic process, a photoresist R6 covering the HVNMOS region, the HVPMOS region and the LVNMOS region is formed over the semiconductor substrate 10. Then, by doping p-type impurities (e.g. boron ions) into the semiconductor substrate 10 while using the photoresist R6, the field oxides 11 and the gate electrode 15 as masks, a pair of lightly doped regions 12$p$ sandwiching the region underneath the gate electrode 15 is formed in the LVPMOS region in a self-alignment manner, as shown in FIG. 8B. In this process, as described above, a dose amount of the p-type impurities can be set to about $1 \times 10^{12}$ to $1 \times 10^{13}$/cm$^2$, for instance. After doping the p-type impurities, the photoresist R6 is removed.

Figure 8C:
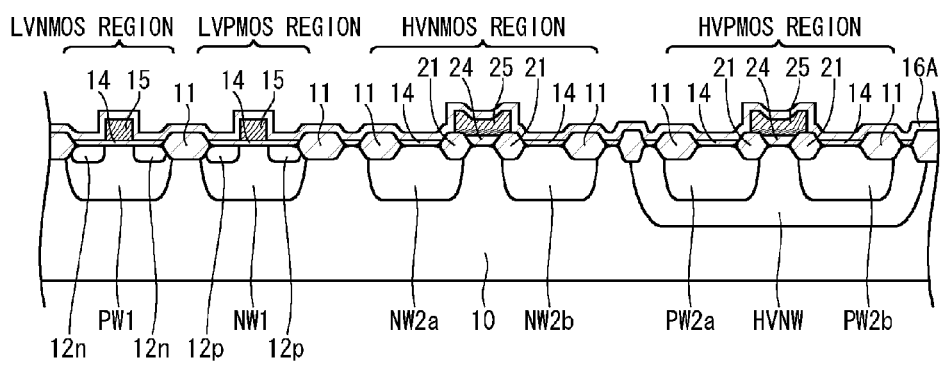

Next, by depositing silicon nitride over the semiconductor substrate 10 using a known CVD method, the silicon nitride film 16A having a thickness of about 100 to 200 nm, for instance, is formed over the semiconductor substrate 10, as shown in FIG. 8C.

Next, by conducting an anisotropic dry etching process on the silicon nitride film 16A, sidewall spacers 16 having a thickness of about 100 to 200 nm, for instance, are formed on the sides of the gate electrodes 15 and sidewall spacers 26 having a thickness of about 100 to 200 nm, for instance, are formed on the sides of the gate electrodes 25, as shown in FIG. 9A.

Next, by conducting a known photolithographic process, a photoresist R7 covering regions where p-type impurities are to be doped is formed over the semiconductor substrate 10. The regions where the p-type impurities are to be doped include the active region in the LVPMOS region, the two active regions in the HVPMOS region where the p well regions PW2$a$ and PW2$b$ are formed, and regions where guard ring layers 31$p$ are to be formed in a post process. Then, by doping n-type impurities (e.g. phosphorus ions) into the semiconductor substrate 10 while using the photoresist R7, the field oxides 11 and 21, the gate electrodes 15 and 25 and the sidewall spacers 16 and 26 as masks, as shown in FIG. 9B, a pair of highly doped regions 13$n$ sandwiching the region underneath the gate electrode 15 and the sidewall spacers 16 are formed in the LVNMOS region, a pair of highly doped regions 23$n$ sandwiching the region underneath the gate electrode 25, the sidewall spacers 26 and the field oxides 21 are formed in the HVNMOS region, and the guard ring layers 32$n$ are formed in the active regions surrounding the HVPMOS region. In this process, as described above, a dose amount of the n-type impurities can be set to about $6.0 \times 10^{15}$/cm$^2$, for instance. After doping the n-type impurities, the photoresist R7 is removed.

Next, by conducting a known photolithographic process, a photoresist R8 covering the regions where the n-type impurities have been doped in the above processes is formed over the semiconductor substrate 10. As described above, the regions where the n-type impurities have been doped include the active region in the LVNMOS, the two active regions in the HVNMOS region where the n well regions NW2$a$ and NW2$b$ are formed, and the regions where the guard ring layers 32$n$ have been formed. Then, by doping p-type impurities (e.g. boron ions) into the semiconductor substrate 10 while using the photoresist R8, the field oxides 11 and 21, the gate electrodes 15 and 25, and the sidewall spacers 16 and 26 as masks, as shown in FIG. 9C, a pair of highly doped regions 13$p$ sandwiching the region underneath the gate electrode 15 and the sidewall spacers 16 are formed in the LVPMOS region, a pair of doped regions 23$p$ sandwiching the region underneath the gate electrode 25, the sidewall spacers 26 and the field oxides 21 are formed in the HVPMOS region, and the guard ring layers 31$p$ are formed in the active regions surrounding the HVNMOS region. In this process, as described above, a dose amount of the p-type impurities can be set to about $5.0 \times 10^{15}$/cm$^2$, for instance. After doping the p-type impurities, the photoresist R8 is removed.

Taking the processes described above, the low voltage nMOS transistor 1$n$, the low voltage pMOS transistor 1$p$, the high voltage nMOS transistor 2$n$ and the high voltage pMOS transistor 2$p$ are formed on the same semiconductor substrate 10. Next, by depositing silicon oxide over the semiconductor substrate 10, an interlayer insulation film 18 burying the low voltage nMOS transistor 1$n$, the low voltage pMOS transistor 1$p$, the high voltage nMOS transistor 2$n$ and the high voltage pMOS transistor 2$p$ is formed over the semiconductor substrate 10. Then, contact holes exposing the surfaces of the gate electrodes 15 and 25, the surfaces of the highly doped regions 13n and 13p and the doped regions 23n and 23p in each transistor are formed in the interlayer insulation film 18 using a known photolithographic process and a known etching process, and contact plugs 19 are formed by filling tungsten (W) in the contact holes. Then, wiring layers 20 are formed on the interlayer insulation film 18. Then, processes of forming further interlayer insulation films, contact plugs and wiring layers are done according to need.

Taking the processes described above, the semiconductor device 1 having the structure as represented by the cross section shown in FIG. 1 can be produced.

As described above, in the method of manufacturing a semiconductor device according to the first embodiment of the present invention, first, a semiconductor substrate 10 is prepared. Here, the semiconductor substrate 10 includes active regions, i.e. an LVNMOS region, an LVPMOS region, regions underneath where gate electrodes 25 are to be formed in an HVNMOS region and an HVPMOS region, a pair of regions where doped regions 23n are to be formed in the HVNMOS region and a pair of regions where doped regions 23p are to be formed in the HVPMOS region, and field oxides 11 which isolate these regions from one another. Next, a silicon nitride film 44 for preventing the semiconductor substrate 10 from being oxidizing is formed on the semiconductor substrate 10. Here, the silicon nitride film 44 has openings on the active regions where the gate electrodes 25 are to be formed and on the field oxides 11 adjacent to these active regions, respectively. Next, thermal oxidation is conducted on the parts of the semiconductor substrate 10 and the field oxides 11 exposed by the openings in the silicon nitride film 44 in order to form gate insulators 24 on the regions underneath where gate electrodes 25 are to be formed and to thicken the field oxides 11 exposed at the openings. In this way, field oxides 21 are formed. After that, by removing the silicon nitride film 44 and conducting thermal oxidation on the parts of the semiconductor substrate 10 exposed thereby, gate insulators 14 are formed on the LVNMOS region, LVPMOS region and active regions of the HVNMOS and HVPMOS regions where sources and drains are formed, respectively, the gate insulators 14 being thinner than the gate insulators 24. Next, gate electrodes 15 and 25 are formed on the gate insulators 14 and 24, respectively, after which a pair of highly doped regions 13n/13p sandwiching the regions underneath the gate electrodes 15 and pairs of doped regions 23n/23p sandwiching the regions underneath the gate electrode 25 are formed in the semiconductor substrate 10.

According to the first embodiment of the present invention, at the time of forming the gate insulators 24, by covering the active regions where the gate insulators 14 are to be formed with the silicon nitride film 44, which is a protective film for resistance to thermal oxidation, it is no longer necessary to etch the comparatively thick gate insulators 24 at the time of forming the gate insulators 14. By this arrangement, it is possible to prevent the semiconductor substrate 10 from being exposed in the vicinity of bird's beaks in the field oxides 11 which separate the regions where the gate insulators 14 are formed from the other adjacent regions, respectively.

Furthermore, according to the first embodiment of the present invention, the silicon nitride films 44 which are formed as protective films for resistance to thermal oxidation separately from the protective films (i.e. the silicon nitride films 42) used in forming the field oxides 11 are used, and therefore, it is possible to remove the silicon nitride films 42 before forming the gate insulators 24. By this arrangement, it is possible to prevent variations in thickness from being produced in the gate insulators 24 due to the gate insulators 24 being etched at the time of removing the silicon nitride films 42.

Moreover, according to the prior art technology 2, the protective film used in forming the field oxide is continuingly used as the protective film in forming the first gate insulator. Therefore, after the first gate insulator (i.e. the oxide film) is formed, it is necessary to conduct scarifying oxidation for recovering the surface of an edge part of the LOCOS film which has been nitrided. However, the present invention is capable of resolving such problem by realizing the above-described structure.

Furthermore, according to the first embodiment of the present invention, it is possible to protect the gate insulators 24 using the photoresists R2 etc. at the time of removing the silicon nitride films 44. By this arrangement, it is possible to prevent variations in thickness from being produced in the gate insulators 24 due to the process of removing the silicon nitride films 44.

Moreover, in the structure of this embodiment where the silicon nitride films 44 are formed separately from the silicon nitride films 42 used in forming the field oxides 11, it is possible to selectively make the element isolating films 11 thicker according to need. Therefore, according to the first embodiment of the present invention, it is possible to improve voltage withstand characteristics of the semiconductor elements (i.e. the high voltage MOS transistors) including the gate insulators 24 without having to deteriorate operation characteristics of the semiconductor elements (i.e. the low voltage MOS transistors) including the gate insulators 14

Furthermore, according to the first embodiment of the present invention, the comparatively thick gate insulators 24 are not formed on the first, third and fourth active regions where sources and rains are formed. Therefore, it is not necessary to remove the gate insulators 24 at the time of forming the highly doped regions 13n/13p and the doped regions 23n/23p which function as sources and drains. By this arrangement, it is possible to prevent the problem of the field oxides 11, each of which separates the active region from the other adjacent regions, becoming thin.

Second Embodiment

Next, a second embodiment of the present invention will be described in detail with reference to the drawings. In the following, as for the structures that are the same as the first embodiment, the same reference number will be used, and redundant explanations of those structure elements will be omitted.

Structure

Figure 10:
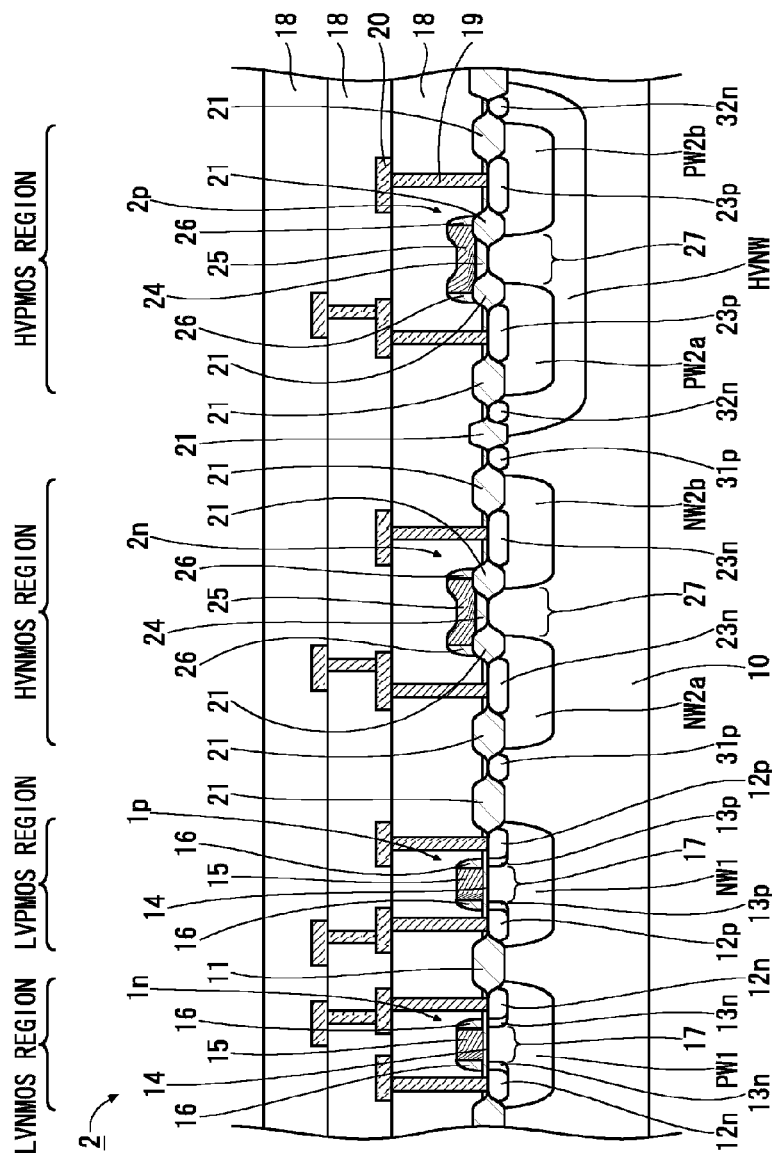
FIG. 10 is a sectional view showing a structure of a semiconductor device 2 according to a second embodiment of the present invention.

FIG. 10 is a sectional view of a structure of the semiconductor device 2 according to the embodiment of the present invention. In this embodiment, as with the first embodiment, the semiconductor device 2 including the low voltage nMOS transistor 1n, the low voltage pMOS transistor 1p, the high voltage nMOS transistor 2n, and the high voltage pMOS transistor 2p will be described. In FIG. 10, as with FIG. 1, in order to show the low voltage nMOS transistor 1n, the low voltage pMOS transistor 1p, the high voltage nMOS transistor 2n and the high voltage pMOS transistor 2p all together, a section of the semiconductor device 2 cut along a line in the gate length direction is shown.

As it is obvious from comparing FIG. 10 with FIG. 1, the semiconductor device 2 of this embodiment has the same structure as the semiconductor device 1 of the first embodiment except that the field oxides 11 in the first embodiment, which isolate the HVNMOS regions and the HVPMOS regions from other regions, are replaced with field oxides 21. The field oxides 21 are thicker than the field oxides 11. Accordingly, in this embodiment, the high voltage nMOS transistor 2n and the high voltage pMOS transistor 2p are isolated from other elements by the thicken field oxides 21. In other words, in this embodiment, field oxides other than those in a region where the LVNMOS regions and/or the LVPMOS regions are laid out (hereinafter to be referred to as a low voltage side region) are made thicker. In addition, a region where the HVNMOS regions and/or the HVPMOS regions are laid out is referred to as a high voltage side region.

As described above, by making the field oxides in the high voltage nMOS transistor 2n and/or the high voltage pMOS transistor 2p having a comparatively high operating voltage impressed thereto and making the field oxides isolating the high voltage side region and the low voltage side region from each other thicker, it becomes possible to reduce influences of electric fields generated from the gate electrodes laying on the field oxides 21.

Since the rest of the structure is the same as the first embodiment, a detailed description thereof will be omitted.

Manufacturing Method

Figure 11A:
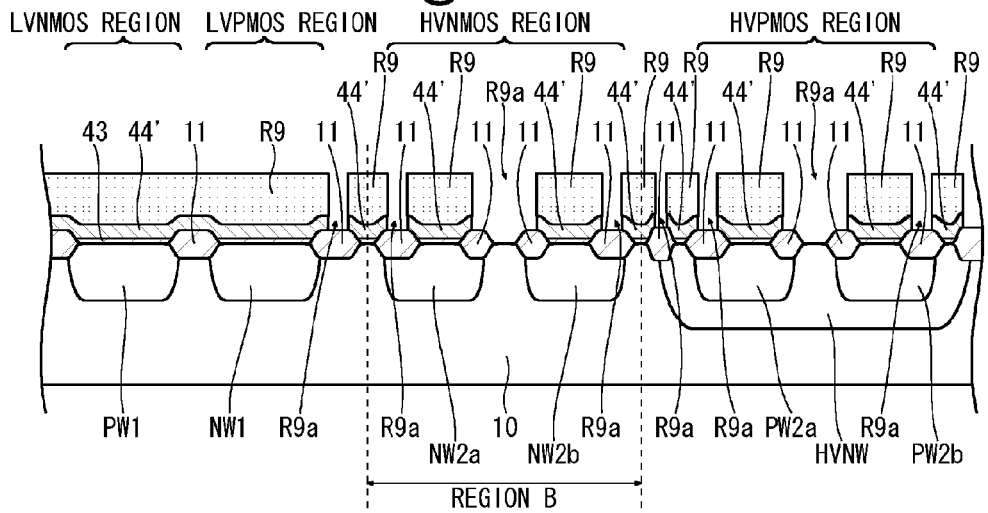
FIG. 11A to FIG. 11C are diagrams showing processes of manufacturing the semiconductor device 1 according to the manufacturing method of the first embodiment of the present invention.

Now, a method of manufacturing the semiconductor device 2 according to this embodiment of the present invention will be described in detail with reference to the drawings. FIG. 11A to FIG. 12 are diagrams showing processes of manufacturing the semiconductor device 2 according to this embodiment of the present invention. In the following, the same processes as the first embodiment will be referred, and redundant explanations of those processes will be omitted.

In this manufacturing method, first, the field oxides 11, which are the LOCOS films, the silicon oxide film 43A and the silicon nitride film 44A, are formed on the semiconductor substrate 10 sequentially using the processes shown in FIG. 2A to FIG. 4A.

Next, by conducting a known photolithographic process, a photoresist R9 is formed on the silicon nitride film 44A. The photoresist R9 has openings R9a over regions where gate electrodes 25 are to be formed in the high voltage side region, over the field oxides 11 respectively isolating these regions where the gate electrodes 25 are to be formed and over the field oxide 11 isolating the high voltage side region and the low voltage side region from each other. In other words, in this process, the photoresist R9 having openings R9a over the field regions 11 except for the ones in the low voltage side region is formed. Then, as with the processes described with reference to FIG. 2B and FIG. 2C, by etching the silicon nitride film 44A while using the photoresist R9 as a mask and etching the silicon oxide film 43A while using the processed silicon nitride film 44A (i.e. the silicon nitride film 44') as a mask, as shown in FIG. 11A, parts of the semiconductor substrate 10 under the openings R9a is exposed. By these processes, the silicon nitride film 44A are processed into the silicon nitride film 44' and the silicon oxide film 43A is processed into a silicon oxide film 43'. Because the silicon nitride film 44A is processed using the photoresist R9 as a mask, it is possible to form the protective film (i.e. the silicon nitride film 44') with a desired shape by only using a photomask used for forming the photoresist R9.

Here, an enlarged overhead view of a region B in FIG. 11A is shown in FIG. 12. As shown in FIG. 12, the photoresist R9 formed in the process shown in FIG. 11A has the openings R9a over the field oxides 11 that isolate a region a1 which is to become the channel forming region 27 and other regions from one another, and isolate a region a2 where the doped region 23n is to be formed and the other regions from one another in the HVNMOS region. This structure is the same as the structure in the HVPMOS region. Moreover, as it is obvious from FIG. 11A, the photoresist R9 has the opening R9a over the field oxide 11 isolating between the high voltage side region (i.e. the HVNMOS region and/or the HVPMOS region) and the low voltage side region (i.e. the LVNMOS region and/or the LVPMOS region). Therefore, in the process shown in FIG. 11A, openings are formed over the field oxides 11 except for the ones in the low voltage side region, and thereby, the silicon nitride film 44A and the silicon oxide film 43A are removed from over these regions (i.e. the field oxides 11 isolating the region a1 which is to become the channel forming region 27 and the other regions and the region a2 where the doped region 23n is to be formed and the other regions from one another, and the field oxide 11 isolating the high voltage side region and the low voltage side region from each other) and parts of the semiconductor substrate 10 in these region are exposed. After etching the silicon nitride film 44A the photoresist R9 is removed.

Figure 11B:
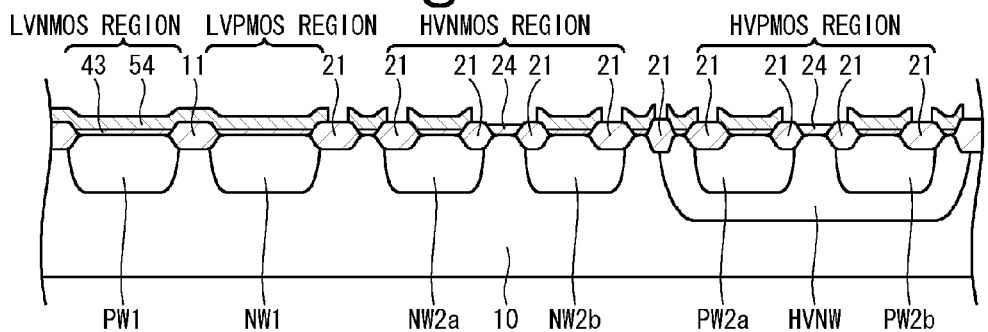
Figure 12:
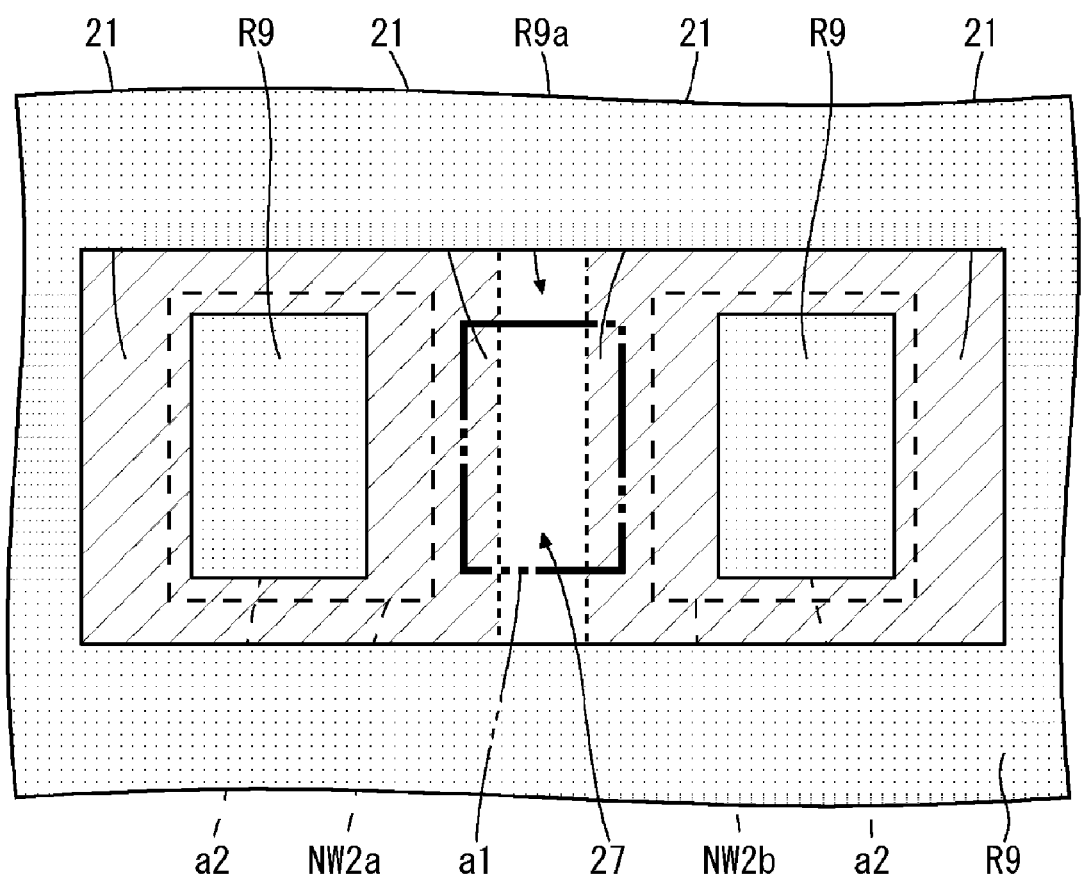
FIG. 12 is a diagram showing the region B in FIG. 11A when viewed from above.

Next, by conducting a thermal oxidation treatment on the surface of the semiconductor substrate 10 while using the silicon nitride film 44' as a mask, as shown in FIG. 11B, gate insulators 24 each having a thickness of about 50 nm, for instance, are formed on the exposed semiconductor substrate 10. By this thermal oxidation treatment, the exposed field oxides 11 become thicker, and it turns into the field oxides 21.

Figure 11C:
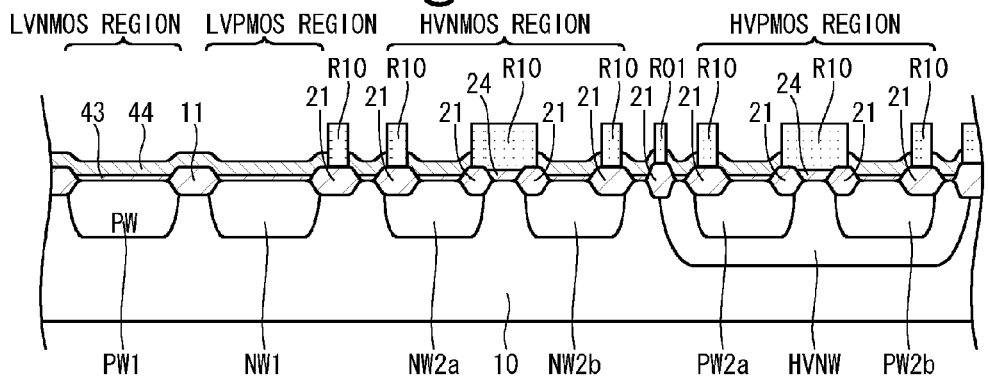

Next, by conducting a known photolithographic process, as shown in FIG. 11C, a photoresist R10 is formed on the exposed gate insulator 24 and the exposed field oxides 21.

Henceforth, as with the processes shown in FIG. 6C to FIG. 9C in the first embodiment, the silicon nitride film 44' and the silicon oxide film 43' are removed, the gate insulators 14 are formed on the exposed semiconductor substrate 10, the gate electrodes 15 and 25 are formed on the gate insulators 14 and 24, respectively, and then, the highly doped regions 13n and 13p and the doped regions 23n and 23p are formed in the semiconductor substrate 10.

Taking the processes described above, the low voltage nMOS transistor 1n, the low voltage pMOS transistor 1p, the high voltage nMOS transistor 2n and the high voltage pMOS transistor 2p are formed on the semiconductor substrate 10. Next, by depositing silicon oxide over the semiconductor substrate 10, an interlayer insulation film 18 burying the low voltage nMOS transistor 1n, the low voltage pMOS transistor 1p, the high voltage nMOS transistor 2n and the high voltage pMOS transistor 2p is formed over the semiconductor substrate 10. Then, contact holes exposing the surfaces of the gate electrodes 15 and 25, the surfaces of the highly doped regions 13n and 13p and the doped regions 23n and 23p in each transistor are formed in the interlayer insulation film 18 using a known photolithographic process and a known etching process, and contact plugs 19 are formed by filling tungsten (W) in the contact holes. Then, wiring layers 20 are formed on the interlayer insulation film 18. Then, processes of forming further interlayer insulation films, contact plugs and wiring layers are done according to need.

Taking the processes described above, the semiconductor device 2 having the structure as represented by the cross section shown in FIG. 10 can be produced.

According to the second embodiment of the present invention, by having the structure and the manufacturing method described above, it is possible to provide the effects as with the first embodiment.

Furthermore, in the second embodiment of the present invention, not only the field oxides 11 adjoining the active region in the high voltage side region, where the gate electrode is formed, but also the field oxides 11 in the high voltage side region are made thicker. Therefore, it is possible to improve the withstand voltage characteristics of the high voltage nMOS transistor and the high voltage pMOS transistor as compared with the first embodiment.

While the preferred embodiments of the invention have been described using specific terms, such description is for illustrative purposes only, and it is to be understood that changes and variations may be made without departing from the spirit or the scope of the following claims.

This application claims priority to Japanese Patent Application No. 2005-94373. The entire disclosures of Japanese Patent Application No. 2005-94373 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially," "about," and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

What is claimed is:

1. A method of manufacturing a semiconductor device, comprising:
   preparing a semiconductor substrate having first to fourth active regions and element isolating insulation films, the third and fourth active regions sandwiching the second active region, and the element isolating insulation films isolating the first to fourth active regions;
   forming a protective film for preventing the semiconductor substrate from being oxidized, the protective film having an opening over the second active region and the element isolating insulation film adjoining the second active region;
   forming a first gate insulation film on the second active region by conducting a thermal oxidation treatment through the opening;
   removing the protective film;
   forming a second gate insulation film on the first, third and fourth active regions, by conducting a thermal oxidation treatment, the second gate insulation film being thinner than the first gate insulation film;
   forming a first gate electrode on the second gate insulation film over a portion of the first active region, so that a remainder of the first active region is not covered with the first gate electrode;
   forming a second gate electrode on the first gate insulation film over the second active region, so that an entirety of the second active region is covered with the second gate electrode;
   forming a pair of first doped regions as a source and a drain in the first active region; and
   forming a pair of second doped regions as a source and a drain in the third and fourth active regions.

2. The method of manufacturing a semiconductor device according to claim 1, wherein the protective film having the openings is formed by forming a first film for preventing the semiconductor substrate from being oxidized on an entire surface of the semiconductor substrate, and removing areas of the first film on the second active region and the element isolating insulation film adjoining the second active region.

3. The method of manufacturing a semiconductor device according to claim 1, further comprising:
   forming sidewall spacers on sides of the gate electrodes,
   wherein the first and second doped regions are formed by implanting impurities into the first, third and fourth regions in a self aligning manner while using the gate electrodes and the sidewall spacers as masks.

4. The method of manufacturing a semiconductor device according to claim 1, wherein the semiconductor substrate is a silicon substrate, and the protective film is a silicon nitride film.

5. A method of manufacturing a semiconductor device, comprising:
   preparing a semiconductor substrate having first to fourth active regions and element isolating insulation films, the third and fourth active regions sandwiching the second active region, and the element isolating insulation films isolating the first to fourth active regions respectively;
   forming a protective film for preventing the semiconductor substrate from being oxidized, the protective film having openings over the second active region and the element isolating insulation film adjoining at least one of the second to fourth active regions;
   forming a first gate insulation film on the second active region by conducting a thermal oxidation treatment through the openings;
   removing the protective film;
   forming a second gate insulation film on the first, third and fourth active regions, by conducting a thermal oxidation treatment, the second gate insulation film being thinner than the first gate insulation film;
   forming a first gate electrode on the second gate insulation film over a portion of the first active region, so that a remainder of the first active region is not covered with the first gate electrode;
   forming a second gate electrode on the first gate insulation film over the second active region, so that an entirety of the second active region is covered with the second gate electrode;
   forming a pair of first doped regions as a source and a drain in the first active region; and
   forming a pair of second doped regions as a source and a drain in the third and fourth active regions.

6. The method of manufacturing a semiconductor device according to claim 5, wherein the protective film having the openings is formed by forming a first film for preventing the semiconductor substrate from being oxidized on an entire surface of the semiconductor substrate, and removing areas of the first film on the second active region and the element isolating insulation film adjoining at least one of the second to fourth active regions.

7. The method of manufacturing a semiconductor device according to claim 5, further comprising:
   forming sidewall spacers on sides of the gate electrodes,
   wherein the first and second doped regions are formed by implanting impurities into the first, third and fourth regions in a self-aligning manner while using the gate electrodes and the sidewall spacers as masks.

8. The method of manufacturing a semiconductor device according to claim 5, wherein the semiconductor substrate is a silicon substrate, and the protective film is a silicon nitride film.

9. A method of manufacturing a semiconductor device, comprising:

provebidng a semiconductor substrate having first to fourth active regions and element isolating insulation films, the second active region being located between the third and fourth active regions, and the element isolating insulation films being located around the first to fourth active regions;

forming a protective film for preventing the semiconductor substrate from being oxidized, the protective film having an opening over the second active region and the element isolating insulation film adjacent to the second active region;

oxidizing a surface of the second active region through the opening to form a first gate insulation film on the second active region;

removing the protective film;

oxidizing a surface of the first, third and fourth active regions to form a second gate insulation film on the first, third and fourth active regions, the second gate insulation film being thinner than the first gate insulation film;

forming a first gate electrode on the second gate insulation film over a portion of the first active region, so that a remainder of the first active region is not covered with the first gate electrode;

forming a second gate electrode on the first gate insulation film over the second active region, so that an entirety of the second active region is covered with the second gate electrode;

forming a pair of first doped regions as a source and a drain in the first active region; and forming a pair of second doped regions as a source and a drain in the third and fourth active regions.

10. The method of manufacturing a semiconductor device according to claim 9, wherein said forming a protective film comprises forming a first film for preventing the semiconductor substrate from being oxidized on an entire surface of the semiconductor substrate, and removing areas of the first film on the second active region and the element isolating insulation film adjoining the second active region.

11. The method of manufacturing a semiconductor device according to claim 9, further comprising:

forming sidewall spacers on sides of the gate electrodes, wherein the first and second doped regions are formed by implanting impurities into the first, third and fourth regions in a self-aligning manner while using the gate electrodes and the sidewall spacers as masks.

12. The method of manufacturing a semiconductor device according to claim 9, wherein the semiconductor substrate is a silicon substrate, and the protective film is a silicon nitride film.

* * * * *